United States Patent
Goh et al.

(10) Patent No.: US 9,379,034 B1
(45) Date of Patent: Jun. 28, 2016

(54) METHOD OF MAKING AN ELECTRONIC DEVICE INCLUDING TWO-STEP ENCAPSULATION AND RELATED DEVICES

(71) Applicant: STMICROELECTRONICS PTE LTD, Singapore (SG)

(72) Inventors: Kim-Yong Goh, Singapore (SG); Yiyi Ma, Singapore (SG); Xueren Zhang, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 0 days.

(21) Appl. No.: 14/585,566

(22) Filed: Dec. 30, 2014

(51) Int. Cl.
| | | |
|---|---|---|
| *H01L 23/10* | (2006.01) | |
| *H01L 23/31* | (2006.01) | |
| *H01L 23/498* | (2006.01) | |
| *H01L 23/367* | (2006.01) | |
| *H01L 23/00* | (2006.01) | |
| *H01L 21/56* | (2006.01) | |

(52) U.S. Cl.
CPC ............ *H01L 23/3135* (2013.01); *H01L 21/56* (2013.01); *H01L 23/3675* (2013.01); *H01L 23/49816* (2013.01); *H01L 24/49* (2013.01); *H01L 24/85* (2013.01); *H01L 2224/48106* (2013.01); *H01L 2224/48227* (2013.01); *H01L 2924/14* (2013.01)

(58) Field of Classification Search
CPC .............. H01L 21/561; H01L 23/3107; H01L 23/3128; H01L 23/4334; H01L 23/49503; H01L 23/552; H01L 24/49; H01L 24/97; H01L 21/565; H01L 23/3142; H01L 24/48; H01L 2224/48227; H01L 2924/15311; H01L 2924/16152

USPC .......... 257/675–676, 707, 765, 706; 438/111, 438/107, 118, 125–127
See application file for complete search history.

(56) References Cited

U.S. PATENT DOCUMENTS

| | | | | |
|---|---|---|---|---|
| 6,462,405 | B1 * | 10/2002 | Lai | ........................ H01L 23/16 257/669 |
| 6,534,859 | B1 * | 3/2003 | Shim, II | ............. H01L 23/3128 257/675 |
| 6,614,123 | B2 * | 9/2003 | Lee | ....................... H01L 21/565 257/783 |
| 6,969,640 | B1 * | 11/2005 | Dimaano Jr. | .......... H01L 21/565 257/E21.504 |
| 7,253,529 | B2 | 8/2007 | Tao et al. | |
| 2007/0090502 | A1 * | 4/2007 | Zhao | ................... H01L 23/3128 257/675 |
| 2008/0122067 | A1 * | 5/2008 | Wang | .................. H01L 23/4334 257/706 |

(Continued)

OTHER PUBLICATIONS

Tran et al., "Packaging Challenges in Low-k Silicon with Thermally Enhanced Ball Grid Array (TE-PBGA)", 2010 12th EPTC, pp. 179-184.

(Continued)

*Primary Examiner* — Dung Le
(74) *Attorney, Agent, or Firm* — Allen, Dyer, Doppelt, Milbrath & Gilchrist, P.A.

(57) ABSTRACT

A method of making an electronic device may include positioning an integrated circuit (IC) die on an upper surface of a grid array substrate having connections on a lower surface thereof and coupling respective bond pads of the IC die to the grid array with bond wires. The method may also include forming a first encapsulating layer over the IC die and bond wires and positioning a heat spreader on the substrate above the first encapsulating layer after forming the first encapsulating layer. The method may further include forming a second encapsulating layer over the first encapsulating layer and embedding the heat spreader in the second encapsulating layer.

21 Claims, 7 Drawing Sheets

(56) References Cited

U.S. PATENT DOCUMENTS

2011/0292612 A1* 12/2011 Osenbach ............... H01L 23/36
361/719
2014/0213018 A1* 7/2014 Higgins, III .......... H01L 21/565
438/118

OTHER PUBLICATIONS

Dunkerton, S.B., "Glob top materials to chip on board components", ICAWT, Columbus, Ohio, USA, Sep. 30- Oct. 2, 1998, 8 pgs.

* cited by examiner

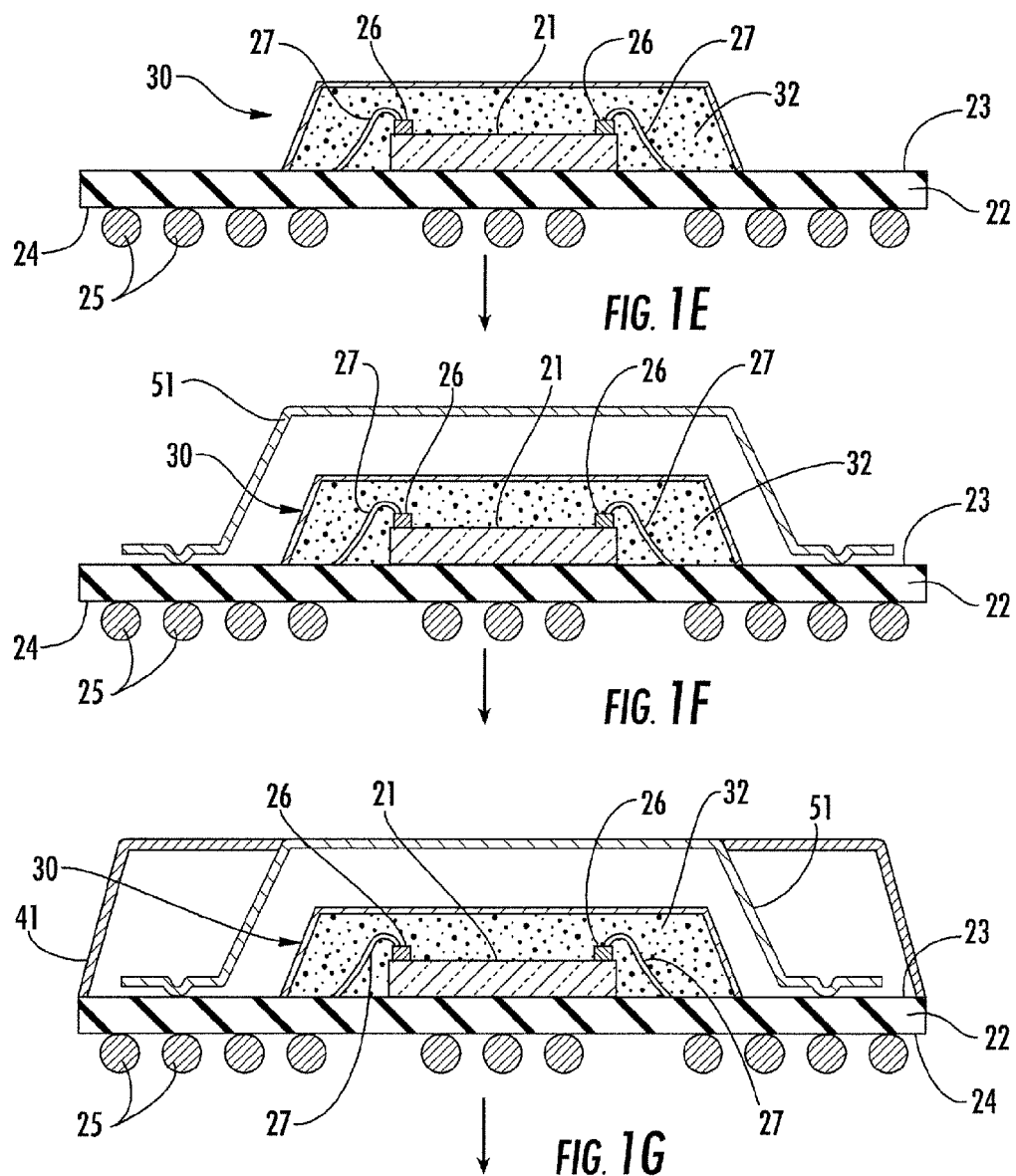

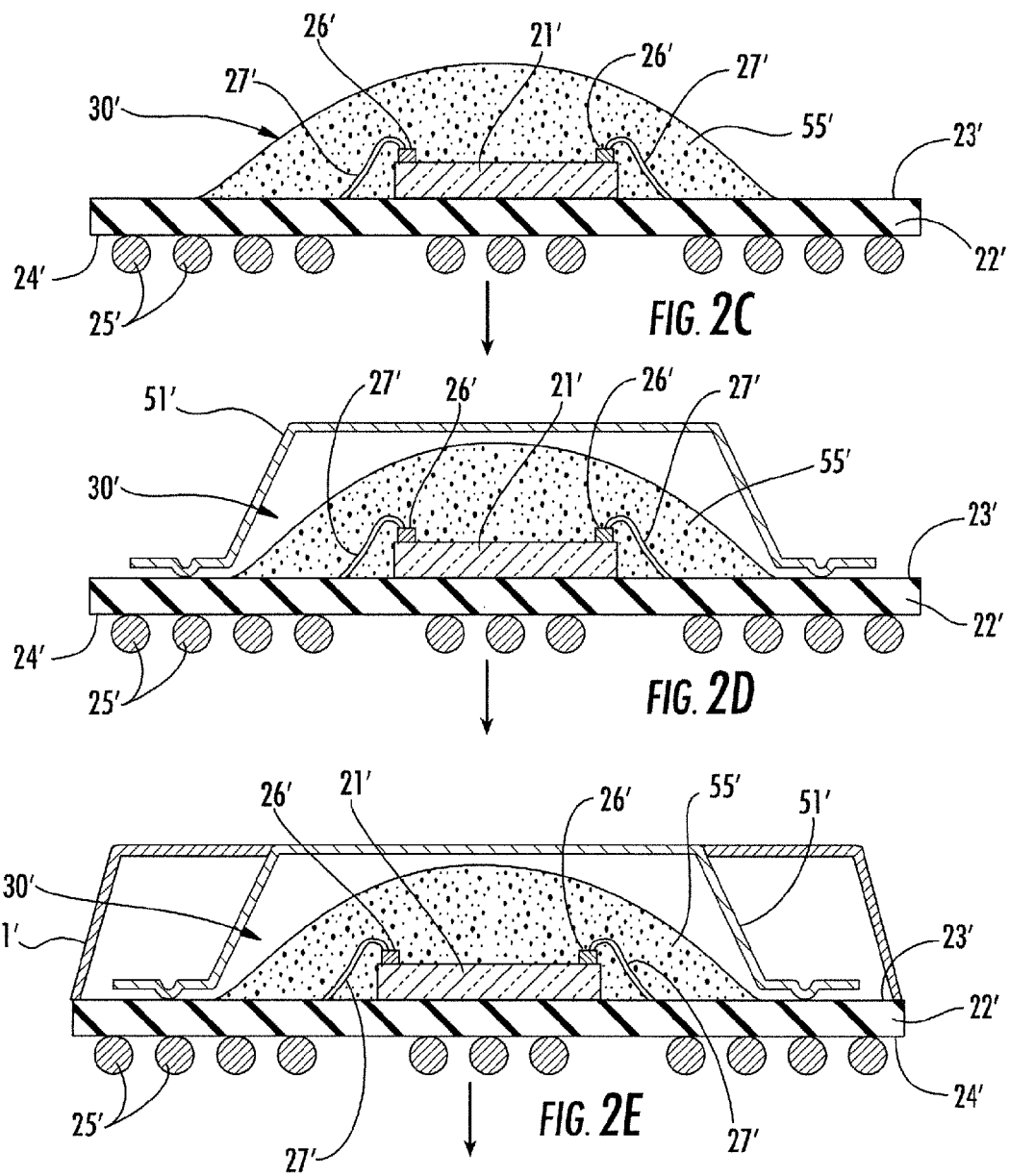

METHOD OF MAKING AN ELECTRONIC DEVICE INCLUDING TWO-STEP ENCAPSULATION AND RELATED DEVICES

TECHNICAL FIELD

The present invention is directed to electronic devices, and more particularly, to method of making an electronic device including an integrated circuit and related devices.

BACKGROUND

As electronic devices become relatively smaller, packaging may become of particular interest. For example, a low-k interlayer dielectric (ILD) material may be used in place of a $SiO_2$ ILD to reduce interconnect delay, for example.

The introduction of a low-K ILD material into silicon may impose new challenges for high wire density packaging. In particular, the inherently weak adhesion in the low-k interconnect makes the silicon more susceptible to a failure that may often be called ILD crack or delamination. ILD crack or delamination causes failure of the electronic device, which often happens during temperature cycling tests, for example. The technical article entitled, *"Packaging Challenges in Low-k Silicon with Thermally Enhanced Ball Grid Array (TE-PBGA)"*, EPTC 2010 by Tran et al. highlights the problems with a low-K ILD material.

As described in the Tran et al. technical article, one cause of the low-k failure has been determined to be the non-uniform distribution of mold compound fillers in the die corner opposite the mold gate. The drop-in heat spreader obstructs the mold compound flow during the transfer molding process, which resulted in greater filler loss in this corner.

SUMMARY

A method of making an electronic device may include positioning an integrated circuit (IC) die on an upper surface of a grid array substrate having a plurality of connections on a lower surface thereof and coupling respective bond pads of the IC die to the grid array with bond wires. The method may also include forming a first encapsulating layer over the IC die and bond wires and positioning a heat spreader on the substrate above the first encapsulating layer after forming the first encapsulating layer. The method may further include forming a second encapsulating layer over the first encapsulating layer and embedding the heat spreader in the second encapsulating layer. Accordingly, the method may decrease failure of the electronic device, for example with a two-step encapsulation which may reduce ILD crack and delamination.

The IC die may be rectangularly shaped, for example. Forming the first encapsulating layer may include forming the first encapsulating layer to extend over and cover each corner of the rectangularly shaped IC die.

The first and second encapsulating layers may each include a same encapsulation material. In other embodiments, the first and second encapsulating layers may each include a different encapsulation material. The IC die may include a low-k interlayer dielectric.

Forming the first encapsulating layer may include positioning a first mold onto the grid array substrate, filling the first mold with a first encapsulation material, curing the first encapsulation material, and removing the first mold, for example. Forming the second encapsulating layer may include positioning a second mold onto the grid array substrate, filling the second mold with a second encapsulation material, curing the second encapsulation material, and removing the second mold. Forming the first encapsulating layer may include applying a body of encapsulation material over the IC, and curing the body of encapsulation material, for example.

A device aspect is directed to an electronic device that may include a grid array substrate having a plurality of connections on a lower surface thereof and an integrated circuit (IC) die on an upper surface of the grid array substrate and having bond pads. The electronic device may also include a plurality of bond wires respectively coupling the bond pads to the grid array, a first encapsulating layer having a first encapsulating material over the IC die and bond wires, and a heat spreader carried by the grid array substrate above and spaced from the first encapsulating layer after. The electronic device may further include a second encapsulating layer having a second encapsulating material different than the first encapsulating material over the first encapsulating layer and embedding the heat spreader in the second encapsulating layer.

BRIEF DESCRIPTION OF THE DRAWINGS

FIGS. 1a-1i are schematic cross-sectional views of an electronic device as it is made according to a method of making an electronic device according to an embodiment.

FIGS. 2a-2g are schematic cross-sectional views of an electronic device as it is make according to a method of making an electronic device according to another embodiment.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1A:
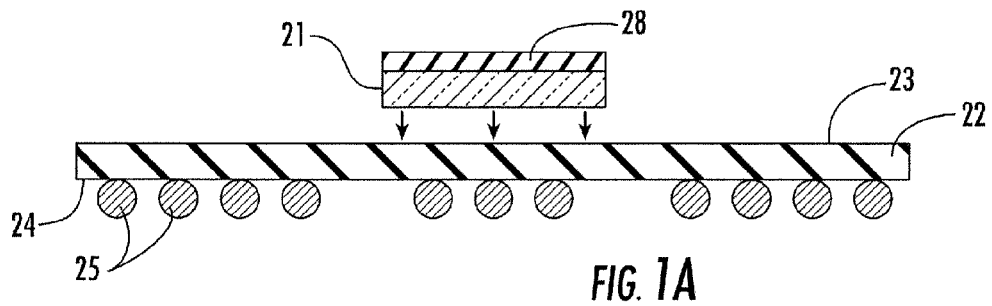

Referring initially to FIGS. 1a-1i, a method of making an electronic device 20 is described. The method includes positioning an integrated circuit (IC) die 21 on an upper surface 23 of a grid array substrate 22. The IC die 21 may include a low-k interlayer dielectric 28 and illustratively has a rectangular shape (FIG. 1a). Of course, the IC die 21 may have other and/or additional interlayers of a same or different material, and may also have a different shape.

The grid array substrate 22 has connections 25 on a lower surface 24 thereof. The grid array substrate 22 is illustratively a ball grid array (BGA) substrate, and more particularly, a plastic ball grid array substrate (PBGA). Of course, the grid array substrate 22 may be another type of substrate, as will be appreciated by those skilled in the art.

Figure 1B:
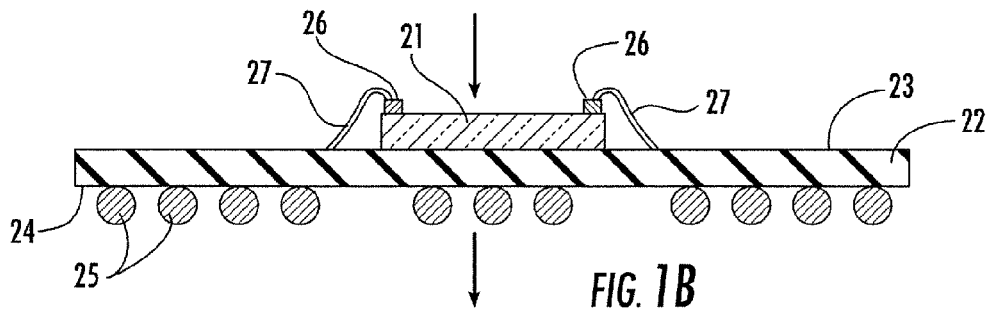

The method includes coupling respective bond pads 26 of the IC die 21 to the grid array substrate 22 with bond wires 27 (FIG. 1b). The method also includes include forming a first encapsulating layer 30 over the IC die 21 and bond wires 27. The first encapsulating layer 30 is formed to extend over and cover each corner of the rectangularly shaped IC die 21.

Figure 1C:
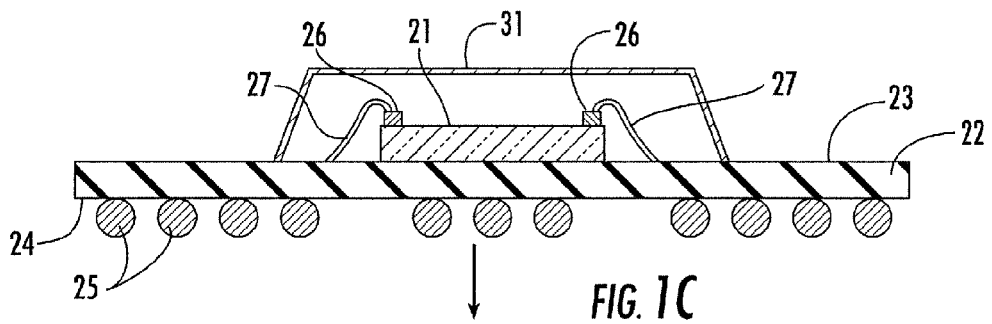
Figure 1D:
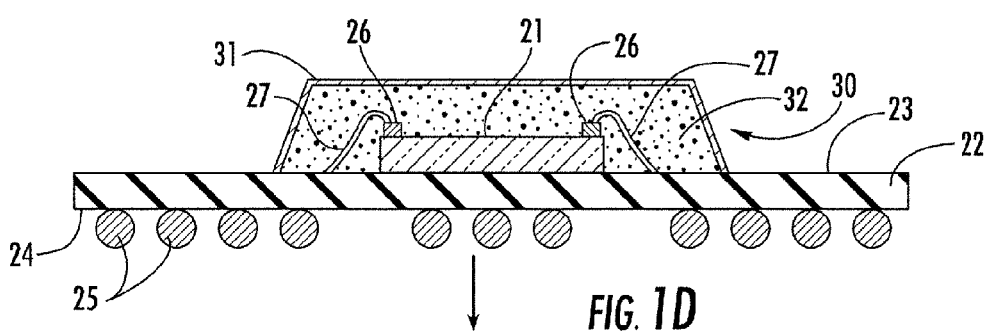
Figure 1H:
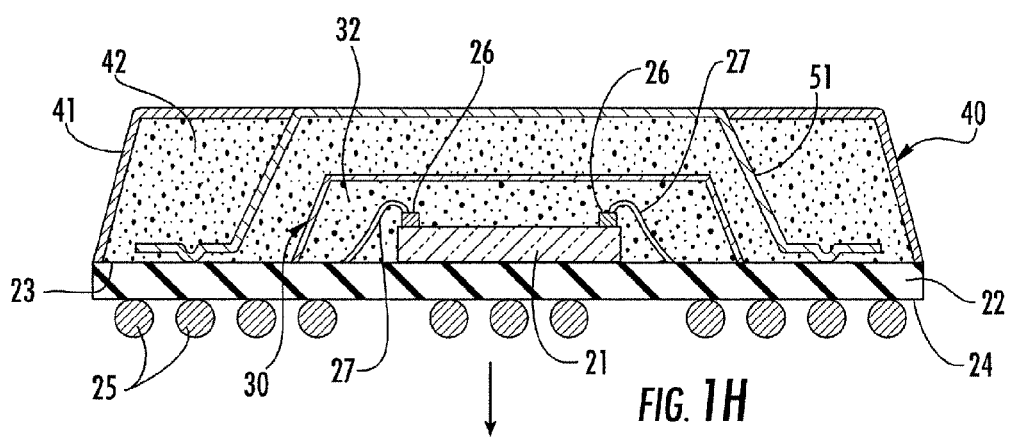

To form the first encapsulating layer 30 a first mold 31 is positioned onto the grid array substrate 22 (FIG. 1c). The first mold 31 is filled with a first encapsulation material 32 and cured (FIG. 1d). The first mold 31 is then removed (FIG. 1e). The first encapsulation material 32 illustratively does not extend to ends of the grid array substrate 22.

The method further includes positioning a heat spreader 51 on the grid array substrate 22 above and spaced from the first encapsulating layer 30 after forming the first encapsulating layer (FIG. 1f). The heat spreader 51 may be copper for example, and is illustratively positioned so that is exposed on an upper surface of the electronic device 20.

Figure 1I:
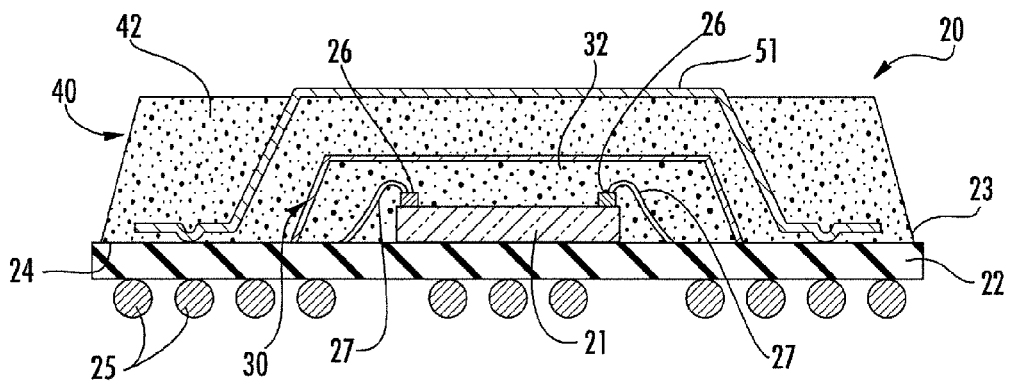

After positioning the heat spreader 51, the method further includes forming a second encapsulating layer 40 over the first encapsulating layer 30 and embedding the heat spreader 51 in the second encapsulating layer. The second encapsulating layer 40 is formed by positioning a second mold 41 onto the grid array substrate 22 (FIG. 1g), filling the second mold with a second encapsulation material 42 and curing the second encapsulation material (FIG. 1h), and removing the second mold (FIG. 1i). The first and second encapsulation materials may each be the same material. In some embodiments, the first and second encapsulation materials may be different materials.

Referring now to FIGS. 2a-2g, in another embodiment, the first encapsulating layer 30' is formed by applying a body of first encapsulation material 55' over the IC die 21'. The body of first encapsulation material 55' (FIG. 2c) is a glob top material, for example. More particularly, the body of first encapsulation material 55' may be a low modulus glob top resin that may be a thermosetting or a thermoplastic resin. In other words, no mold is used. As will be appreciated by those skilled in the art, a low modulus glob top resin, for example, may advantageously provide a relatively low cost packaging approach for chip-on-board technology.

Figure 2A:
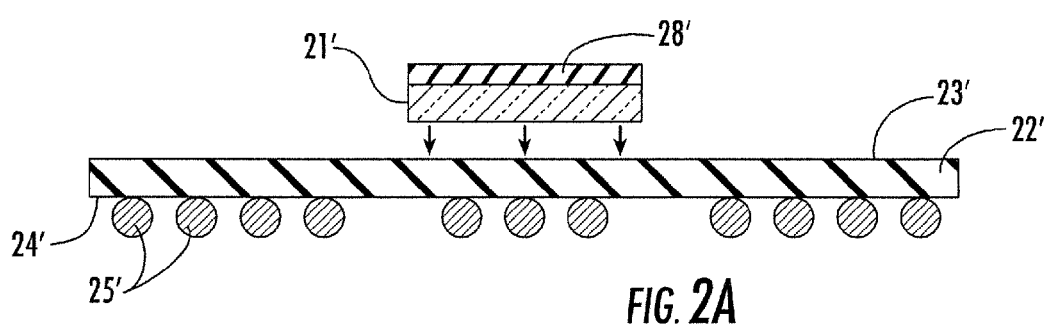
Figure 2B:
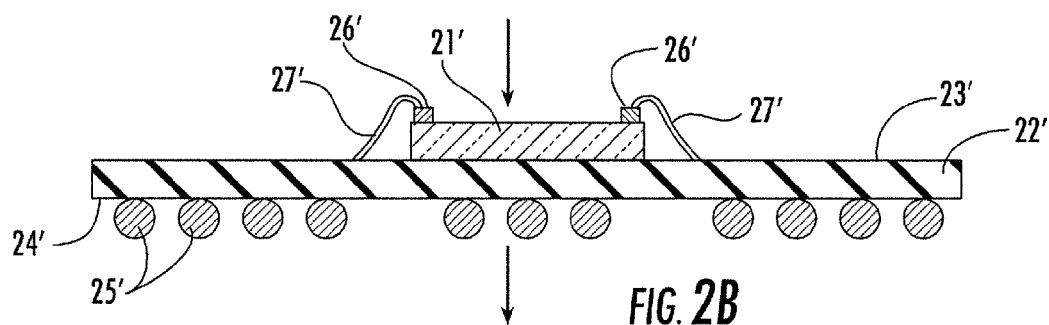
Figure 2F:
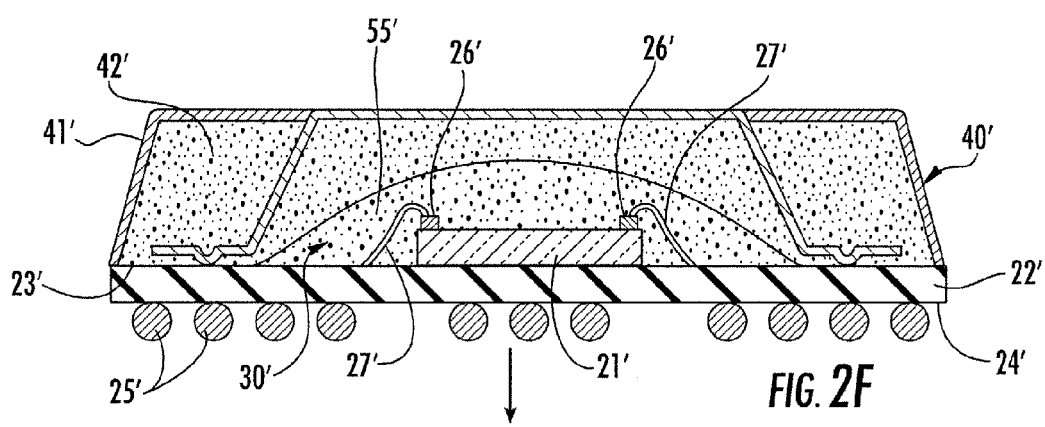

It should be noted that while not specifically described, the method steps corresponding to FIGS. 2a-2b are similar to those described with respect to FIGS. 1a-1b. The body of first encapsulation material 55' is allowed to cure.

Similar to the embodiment described above, and particularly, with respect to FIG. 1f, the method of the present embodiment further includes positioning a heat spreader 51' on the grid array substrate 22' above and spaced from the first encapsulating layer 30' after forming the first encapsulating layer (FIG. 2d).

Figure 2G:
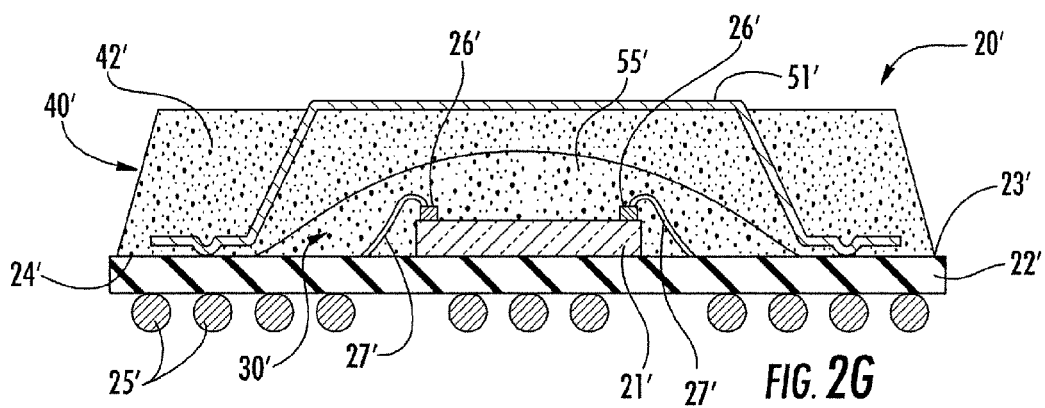

After positioning the heat spreader 51', the method further includes forming a second encapsulating layer 40' over the first encapsulating layer 30' and embedding the heat spreader 51' in the second encapsulating layer. The second encapsulating layer 40' is formed by positioning a second mold 41' onto the grid array substrate 22' (FIG. 2e), filling the second mold with a second encapsulation material and curing the second encapsulation material (FIG. 2f), and removing the second mold (FIG. 2g). Of course, in some embodiments, the second mold and second encapsulation material may be replaced with a second body of encapsulating material, for example a glob top material.

Indeed, as will be appreciated by those skilled in the art, the forming of the first and second encapsulation layers advantageously may provide a more uniform distribution of the encapsulating material in the corners of the die opposite a gate of the mold gate. In prior art encapsulating methods, the heat spreader generally obstructed the flow of the encapsulating material during the transfer molding process, which resulted in greater loss of encapsulating material in this corner. The two-step method of forming the first and second encapsulating layers may provide reduced losses in the corners of the die, and may thus reduce failure.

Figure 3:
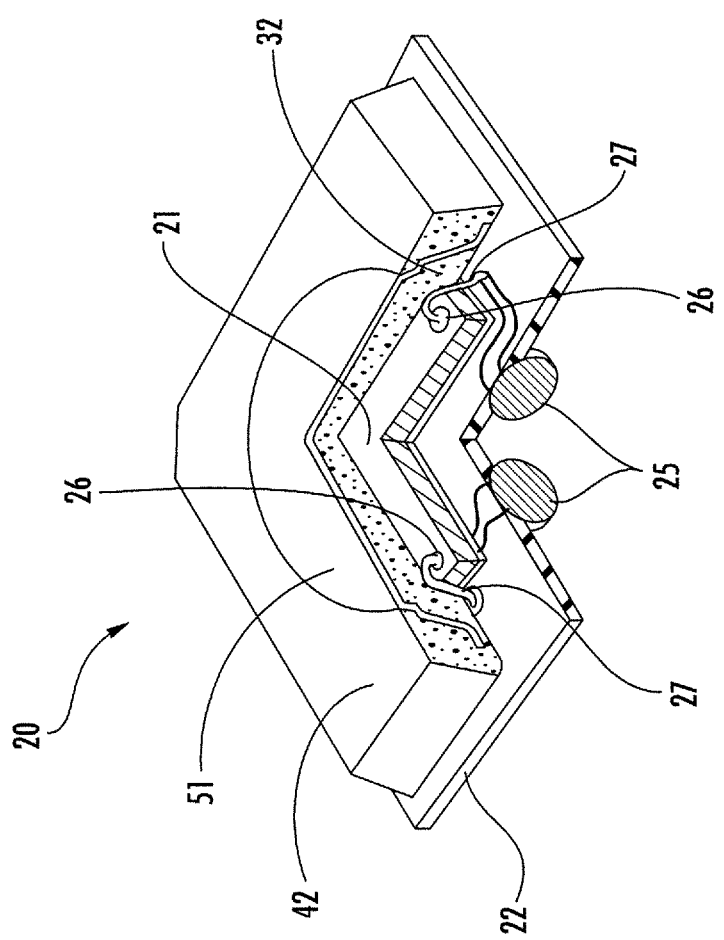
FIG. 3 is a perspective cut-away view of an electronic device in accordance with an embodiment.

Referring now additionally to FIG. 3, a device aspect is directed to an electronic device 20 that includes a grid array substrate 22 having a plurality of connections 25 on a lower surface 24 thereof and an IC die 21 on an upper surface 23 and having bond pads 26. The electronic device 20 also includes a plurality of bond wires 27 respectively coupling the bond pads 26 to the grid array substrate 22, and a first encapsulating layer 30 having a first encapsulating material over the IC die 21 and bond wires 27. A heat spreader 51 is carried by the grid array substrate 22 above and spaced from the first encapsulating layer 30. A second encapsulating layer 40 having a second encapsulating material different than the first encapsulating material is over the first encapsulating layer 30 and embeds the heat spreader 51 in the second encapsulating layer.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:
1. A method of making an electronic device comprising:
   positioning an integrated circuit (IC) die on an upper surface of a grid array substrate having a plurality of connections on a lower surface thereof;
   coupling respective bond pads of the IC die to the grid array substrate with bond wires;
   forming a first encapsulating layer over the IC die and bond wires;
   positioning a heat spreader on the substrate above the first encapsulating layer after forming the first encapsulating layer, the heat spreader comprising at least one leg coupled to and extending upwardly from the substrate and a body coupled to the at least one leg and spaced above the first encapsulating layer; and
   forming a second encapsulating layer over the first encapsulating layer and embedding the heat spreader in the second encapsulating layer.

2. The method of claim 1 wherein the IC die is rectangularly shaped, and wherein forming the first encapsulating layer comprises forming the first encapsulating layer to extend over and cover each corner of the rectangularly shaped IC die.

3. The method of claim 1 wherein the first and second encapsulating layers each comprises a same encapsulating material.

4. The method of claim 1 wherein the first and second encapsulating layers each comprises a different encapsulating material.

5. The method of claim 1 wherein the IC die comprises a low-k interlayer dielectric.

6. The method of claim 1 wherein forming the first encapsulating layer comprises positioning a first mold onto the grid array substrate, filling the first mold with a first encapsulation material, curing the first encapsulation material, and removing the first mold.

7. The method of claim 1 wherein forming the second encapsulating layer comprises positioning a second mold onto the grid array substrate, filling the second mold with a second encapsulation material, curing the second encapsulation material, and removing the second mold.

8. The method of claim 1 wherein forming the first encapsulating layer comprises applying a body of encapsulation material over the IC, and curing the body of encapsulation material.

9. A method of making an electronic device comprising:
positioning an integrated circuit (IC) die on an upper surface of a grid array substrate having a plurality of connections on a lower surface thereof;
coupling respective bond pads of the IC die to the grid array substrate with bond wires;
forming a first encapsulating layer over the IC die and bond wires by
positioning a first mold onto the grid array substrate,
filling the first mold with a first encapsulation material,
curing the first encapsulation material, and
removing the first mold;
positioning a heat spreader on the substrate above the first encapsulating layer after forming the first encapsulating layer; and
forming a second encapsulating layer over the first encapsulating layer and embedding the heat spreader in the second encapsulating layer by
positioning a second mold onto the grid array substrate,
filling the second mold with a second encapsulating material,
curing the second encapsulation material, and removing the second mold.

10. The method of claim 9 wherein the IC die is rectangularly shaped, and wherein forming the first encapsulating layer comprises forming the first encapsulating layer to extend over and cover each corner of the rectangularly shaped IC die.

11. The method of claim 9 wherein the first and second encapsulating layers each comprises a same encapsulation material.

12. The method of claim 9 wherein the first and second encapsulating layers each comprises a different encapsulation material.

13. The method of claim 9 wherein the IC die comprises a low-k interlayer dielectric.

14. The method of claim 9 wherein forming the first encapsulating layer over the IC comprises applying a body of encapsulation material over the IC, and curing the body of encapsulation material.

15. An electronic device comprising:
a grid array substrate having a plurality of connections on a lower surface thereof;
an integrated circuit (IC) die on an upper surface of said grid array substrate and having bond pads;
a plurality of bond wires respectively coupling said bond pads to said grid array substrate;
a first encapsulating layer having a first encapsulating material over the IC die and bond wires;
a heat spreader carried by said grid array substrate above and spaced from said first encapsulating layer, said heat spreader comprising at least one leg coupled to and extending upwardly from said grid array substrate and a body coupled to the at least one leg and spaced above said first encapsulating layer; and
a second encapsulating layer having a second encapsulating material different than the first encapsulating material over the first encapsulating layer and embedding the heat spreader in the second encapsulating layer.

16. The electronic device of claim 15 wherein the IC die is rectangularly shaped, and wherein the first encapsulating layer extends over and covers each corner of the rectangularly shaped IC die.

17. The electronic device of claim 15 wherein the IC die comprises a low-k interlayer dielectric.

18. A method of making an electronic device comprising:
positioning an integrated circuit (IC) die on an upper surface of a grid array substrate having a plurality of connections on a lower surface thereof;
coupling respective bond pads of the IC die to the grid array substrate with bond wires;
forming a first encapsulating layer over the IC die and bond wires;
positioning a heat spreader on the substrate above the first encapsulating layer after forming the first encapsulating layer; and
forming a second encapsulating layer over the first encapsulating layer and embedding the heat spreader in the second encapsulating layer;
the first and second encapsulating layers each comprising a same encapsulating material.

19. The method of claim 18 wherein the IC die is rectangularly shaped, and wherein forming the first encapsulating layer comprises forming the first encapsulating layer to extend over and cover each corner of the rectangularly shaped IC die.

20. The method of claim 18 wherein the IC die comprises a low-k interlayer dielectric.

21. The method of claim 18 wherein forming the first encapsulating layer comprises applying a body of encapsulation material over the IC, and curing the body of encapsulation material.

* * * * *